United States Patent [19]

Smith

[11] Patent Number: 4,963,511
[45] Date of Patent: Oct. 16, 1990

[54] METHOD OF REDUCING TUNGSTEN SELECTIVITY TO A CONTACT SIDEWALL

[75] Inventor: Gregory C. Smith, Garland, Tex.

[73] Assignee: Texas Instruments Incorporated, Dallas, Tex.

[21] Appl. No.: 126,450

[22] Filed: Nov. 30, 1987

[51] Int. Cl.$^5$ .................. H01L 21/00; H01L 21/02; H01L 21/28; H01L 21/88
[52] U.S. Cl. .................. 437/192; 437/187; 437/189; 437/200; 148/DIG. 19
[58] Field of Search ............... 437/187, 189, 192, 200, 437/193; 148/DIG. 19

[56] References Cited

U.S. PATENT DOCUMENTS

| 4,532,702 | 8/1985 | Gigante et al. | 437/192 |
| 4,582,563 | 4/1986 | Hazuki et al. | 437/192 |
| 4,597,164 | 7/1986 | Havemann | 437/62 |
| 4,720,908 | 1/1988 | Wills | 437/192 |
| 4,804,560 | 2/1989 | Shioya et al. | 437/192 |

FOREIGN PATENT DOCUMENTS

| 0042227 | 3/1983 | Japan | 437/192 |
| 0139026 | 6/1986 | Japan | 437/192 |
| 0204523 | 9/1987 | Japan | 437/192 |
| 0221112 | 9/1987 | Japan | 437/192 |

OTHER PUBLICATIONS

Moriya, T., A Planar Metallization Process–Its Application to Tri-Level Aluminum Interconnection, IEDM 83, 1983, pp. 550–553.

Smith, G., Comparison of Two Contact Plug Techniques for use with Planarized Oxide, Jun. 1986, V-MIC Conf., pp. 403–410.

Saraswat, K., Selective CVD of Jungsten for VLSI Technology, VLSI Science and Technology, vol. 84–87, 1984, pp. 409–419.

Primary Examiner—Olik Chaudhuri
Assistant Examiner—B. Everhart
Attorney, Agent, or Firm—Richard A. Stotlz; James T. Comfort; Melvin Sharp

[57] ABSTRACT

A method is provided for forming a contact plug (40) in a contact (34) on a semiconductor substrate (30). A dielectric layer (32) is applied to the substrate (30) and then etched to form the contact (34). A layer (38) is then formed over the dielectric (32) and the contact (34). The layer (38) is removed from all surfaces, except the vertical sidewalls (36) within the contact (34). A metal plug (40) is then deposited in the contact (34) forming cup-shaped layers (42). The nonselectivity of the layer (38) allows the metal of plug (40) to be applied to the contact (34) without encroaching upon the substrate (30) or forming bumps on the surface (44) of the dielectric (32).

12 Claims, 1 Drawing Sheet

U.S. Patent  Oct. 16, 1990  4,963,511
FIG. 1
(PRIOR ART)
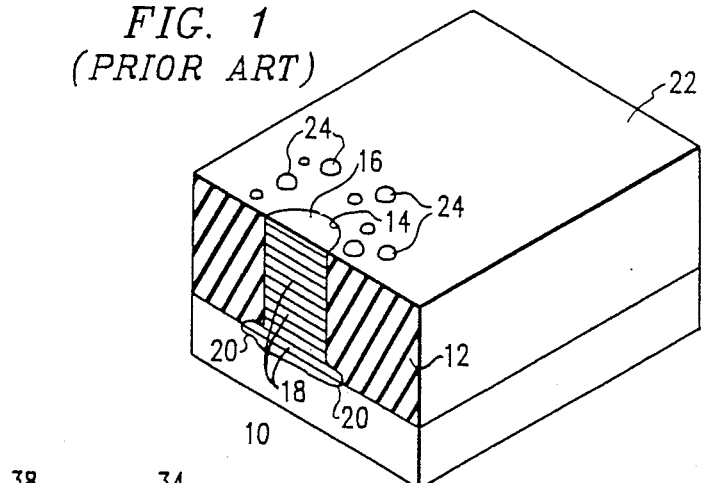
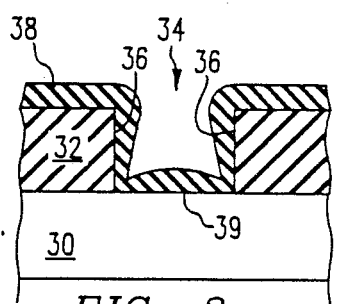
FIG. 2a
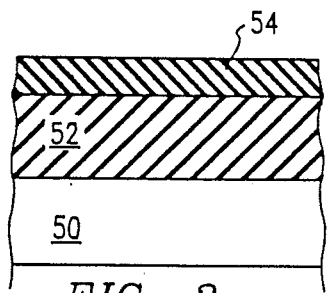
FIG. 3a
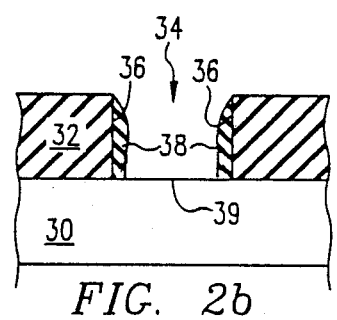
FIG. 2b
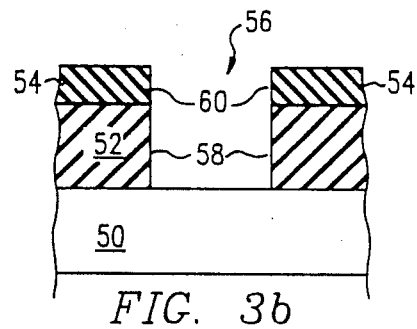
FIG. 3b
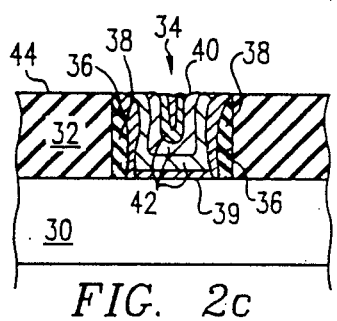
FIG. 2c
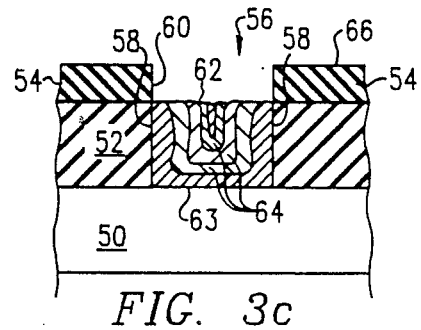
FIG. 3c

METHOD OF REDUCING TUNGSTEN SELECTIVITY TO A CONTACT SIDEWALL

TECHNICAL FIELD OF THE INVENTION

This invention relates in general to semiconductor devices, and in particular to a method of reducing tungsten selectivity to a contact sidewall.

BACKGROUND OF THE INVENTION

The formation of a contact plug on a semiconductor device is well known in the art. A common process for forming a contact plug comprises applying a layer of silicon dioxide ($SiO_2$) to a substrate surface of polysilicon, silicon (Si) or metal. A pattern is then formed on the $SiO_2$ by a standard photoresist process, and a contact or hole is etched into the $SiO_2$.

Tungsten hexafluoride ($WF_6$) plus hydrogen ($H_2$) is used in a chemical vapor deposition (CVD) process, as is well known in the art, to deposit tungsten (W) into the contact. For the CVD process to work, the $H_2$ must be dissociated into atomic H which is reactive with the $WF_6$. The combination of $WF_6$ and atomic H creates W plus hydrogen fluoride (HF). The HF is volatile and, therefore, is rapidly removed as a gas while the W is deposited into the contact.

If the substrate comprises a metallic substance, the metal will provide a catalyst to initiate the disassociation for the $H_2$. Thus, the W from $WF_6$ is allowed to attach to the metallic surface and deposit in layers within the contact. The layers are formed generally horizontal from the bottom of the contact to the top of the contact. Horizontal layering is caused because W is selective to the $SiO_2$, meaning it will not deposit on the $SiO_2$ sidewalls. However, the layering process takes so long to completely fill the contact that while the layering is proceeding, the top surface of the $SiO_2$ also being bombarded with the reaction products from the $WF_6$ and the $H_2$. Eventually, the $SiO_2$ surface may become damaged or contaminated, allowing tungsten nucleation to begin where it is not wanted. This forms W bumps on the surface which may create intralevel shorts in subsequent patterned metal layers.

If the substrate is comprised of Si, or certain metal silicides, the Si does not dissociate the $H_2$ as well as a metal does. Unfortunately, the $WF_6$ will also react with Si to create silicon tetrafluoride ($SiF_4$) which is a gas. The $SiF_4$ creation removes Si from the surface upon which the contact plug is to be built. Thus, as W is deposited, Si is also removed vertically as well as horizontally from under the $SiO_2$ (encroachment). The removal of the Si in both directions is undesirable as it may cause shorting of p/n junctions positioned near the contact.

Due to the layering effect of the W (W being selective to $SiO_2$), the W deposition is a time consuming process. The longer the deposition takes, the more likelihood there is of W also being deposited on the surface of the $SiO_2$. Thus, there is a need for a way to enhance nonselective W deposition in a contact on a substrate without damaging the surrounding surfaces.

SUMMARY OF THE INVENTION

The present invention disclosed and claimed herein describes a method for causing deposition of tungsten (W) on the contact sidewall simultaneously with its deposition on the bottom of the contact during the selective tungsten deposition process which substantially eliminates problems associated with prior tungsten deposition methods. The present invention allows the deposition of W in a contact without lateral encroachment beyond the original edge of the contact, and with reduced, unwanted deposition of tungsten nodules on the dielectric surface.

In accordance with one aspect of the present invention, a method for forming a contact plug on a surface of a semiconductor device is provided. A dielectric layer is formed over the surface of the semiconductor device, and a hole is formed through the dielectric layer. A second layer is deposited on the patterned dielectric, then anisotropically etched back to form a sidewall in the contact while being removed from the top dielectric surfaces as well as the contact bottom. The material to be deposited in this layer must be of a type which readily allows tungsten nucleation during selective tungsten deposition. When the selective tungsten deposition is performed, contact sidewalls will receive tungsten deposition at an equivalent rate to the bottom of the contact. Under these circumstances, the contact closes faster than it would otherwise fill from the bottom. In fact for a contact of diameter w and depth d for $w \leq d$, the deposition time required to fill the contact is less than or equal to half the time required to fill the contact from the bottom. Since the w/d ratio is shrinking as Very Large Scale Integration processing improves, this is a desireable property. The reduced processing time reduces the risk of tungsten nucleation on the dielectric surface. The sidewalls deposited in the contacts allow the natural encroachment of the selective process to move harmlessly under the deposited sidewall material instead of moving under the edge of the oxide and possibly compromising p/n junctions.

In accordance with another aspect of the present invention, silicon dioxide as a dielectric and sputter deposited metal, silicide or silicon nitride is used as the contact sidewalls on which selective tungsten will nucleate preferentially to the silicon dioxide. The metals may be sputtered molybdenum, tungsten, aluminum, chromium or any other $H_2$ dissociating metal or silicide. In a further aspect of the present invention, the dielectric may be doped with boron or phosphorous, or both, in order to make tungsten nucleation on the dielectric less likely.

In yet another aspect of the present invention, a $Si_3N_4/SiO_2$ layered dielectric is used. When the contact is cut, the underlying $Si_3N_4$ is exposed to form the sidewalls of the contact and to provide a more favorable nucleation surface than the top oxide. Silicon nitride supports nucleation of tungsten in the presence of by products of the selective tungsten deposition process to a larger degree than does $SiO_2$ or doped $SiO_2$.

It is a technical advantage of the present invention that W may be deposited in a contact in less time than in prior methods. It is a further technical advantage that the W may be deposited without encroaching under the dielectric layer. It is a still further technical advantage of the present invention that W may be deposited without forming W bumps on the surface of the dielectric layer which may cause shorting between subsequent layers.

BRIEF DESCRIPTION OF THE DRAWINGS

For a more complete understanding of the present invention and for further advantages thereof, reference is now made to the following Detailed Description taken in conjunction with the accompanying Drawings in which:

FIG. 1 is a cross-sectional perspective view of a contact in accordance with the prior art;

FIGS. 2a-2c illustrate in cross-section the steps in accordance with the method of the preferred embodiment of the present invention; and FIGS. 3a-3c illustrate in cross-section the steps of an alternate embodiment of the present invention.

DETAILED DESCRIPTION OF THE INVENTION

In FIGS. 1-3, like items are identified by like and corresponding numerals for ease of reference. Throughout the disclosure of the present invention, the terms selective and nonselective refer to the chemical vapor deposition (CVD) process used to deposit the metal. If a metal deposition process is performed on two materials, A and B, the process is "selective" if the deposition occurs on A, but not on B. If the process always deposits on A, the process is considered to be "selective" to material B if it does not deposit on B and "nonselective" to B if it does deposit on B. Selective tungsten deposition, for example, always deposits on a metal or a semiconductor at the bottom of a contact hole, but is "selective" to the $SiO_2$ insulator which is the dielectric of choice in semiconductor applications. Tungsten deposition is much less selective to $Si_3N_4$ and is nonselective to metals.

Referring to FIG. 1, a contact plug formed in accordance with the prior art is shown. A semiconductor substrate 10 is covered with a dielectric layer 12. A contact hole 14 is formed through the dielectric layer 12 to the substrate 10. The contact 14 is then filled with a metal conductor such as tungsten (W) or molybdenum (Mo), using a selective chemical vapor deposition process, to form a plug 16. The metal of plug 16 generally does deposit on the substrate 10 but does not deposit on the dielectric 12. Therefore the metal conductor of plug 16 is formed in generally horizontal layers as indicated by the lines 18 in the contact 14.

If the substrate 10 comprises silicon (Si), the process by which the plug 16 is formed in the contact 14 will tend to eat away or encroach upon the Si of the substrate 10. This encroachment forms cavities 20 which are filled by the metal conductor of plug 16. The metal conductor of plug 16 also has a tendency to replace the Si in a vertical direction into the substrate 10. Neither of these situations are desirable, as the continuity of the device may be compromised.

The horizontal layering of the conductor takes a relatively long period of time, and, therefore, even though the dielectric 12 is generally selective to the metal conductor of plug 16, some of the metal conductor may be deposited on the surface 22 of the dielectric 12 to form bumps 24. The bumps 24 may produce undesired shorting of subsequent layers.

FIGS. 2a-2c illustrate steps of the process in accordance with the preferred embodiment of the present invention. FIG. 2a illustrates a semiconductor substrate 30 upon which a contact is to be formed. The semiconductor substrate 30 may comprise Si, polysilicon, or metal such as aluminum (Al) or W. A dielectric layer 32 is formed by any appropriate method, such as chemical vapor deposition or plasma enhanced chemical vapor deposition, over the substrate surface 30. The dielectric 32 comprises a field oxide, preferably phosphosilicate glass (phosphorus (P) doped silicon dioxide ($SiO_2$), also known as PSG).

A photoresist pattern, not shown, is placed on the dielectric 32 as is well known in the art. The dielectric layer 32 is then etched by any appropriate method, such as wet chemical etching, plasma etching, or reactive ion etching (RIE), to form a contact hole 34 having vertical sidewalls 36.

After the remaining photoresist is removed, a layer 38 is formed over the dielectric 32, on the sidewalls 36 and on the bottom 39 of the contact 34. The layer 38 may be comprised of, for example, a metal such as Mo, titanium-tungsten (Ti-W) or molybdenum silicide ($MoSi_2$), or a dielectric such as silicon nitride ($Si_3N_4$).

The layer 38 is anisotropically plasma etched or RIE etched to remove the layer 38 from all surfaces except the sidewalls 36 as shown in FIG. 2b. Thus, the layer 38 forms a coating on the sidewalls 36.

As shown in FIG. 2c, a metal is deposited within the contact 34 to form a plug 40. The metal of plug 40 may be any appropriate metal that deposits by chemical vapor deposition and is selective to $SiO_2$ such as, for example, W, Mo or $TaSi_2$. The metal of plug 40 is formed into cup-shaped layers 42 that are generally of equal thickness along the layer 38 on the sidewalls 36 as along the bottom 39 of the contact 34. The metal of plug 40 does not encroach under the dialectric 32, nor does it become deposited upon the surface 44 of the dielectric 32.

In operation, a metal, such as W, is deposited within the contact 34 by chemical vapor deposition (CVD) to form plug 40. In the CVD process, tungsten hexafluoride ($WF_6$) and hydrogen gas ($H_2$) are mixed in a vacuum chamber at temperatures between 300° C. and 700° C. The layer 38 on the vertical sidewalls 36 provide, in conjunction with the substrate surface 30 on the bottom 39, catalysts to dissociate the $H_2$ molecules into atomic H which allows the reaction between $WF_6$ and $H_2$ to begin.

The atomic H combines with fluorine (F) to form hydrogen fluoride (HF) which is volatile and therefore, dissipates as a gas. The W freed by this reaction is then deposited on the layer 38 as equally as it is on the bottom 39 of the contact 34. Due to the nonselective layer 38, the W is deposited in cup-shaped layers 42 rather than in horizontal layers as in the prior art.

Since the W is deposited on the layer 38 simultaneously with the bottom 43, less time is required to fill the contact 34 than in accordance with the prior art. Less time needed to fill the contact 34 lessens the likelihood of encroachment upon the substrate 30 and the formation of W upon the surface 44 of the dielectric layer 32. Thus, a contact plug 40 is formed without creating discontinuities in the surrounding materials.

An alternate embodiment in accordance with the present invention is illustrated in FIGS. 3a-3c. FIG. 3a shows a semiconductor substrate 50 with a first dielectric layer 52 and a second dielectric layer 54. The semiconductor substrate 50 may be any appropriate material, such as metal or Si. The first dielectric layer 52 comprises $Si_3N_4$. The second dielectric layer 54 comprises an oxide, preferably PSG.

$Si_3N_4$ will not, by itself, spontaneously support the dissociation of the $H_2$ into atomic H as a metal will. However, if $Si_3N_4$ is placed proximate a site that will support deposition, such as a substrate of Si, Al or W, a reaction will occur to break down the normal selectivity of the Si$_3$N$_4$. Thus the Si$_3$N$_4$ will effectively become nonselective to the metal to be deposited.

As shown in FIG. 3b, the first and second dielectric layers 52 and 54 have been etched to form contact hole 56. The contact 56 has vertical sidewall portions 58 and 60. Vertical sidewall portion 58 coincides with the first dielectric layer 52, whereas vertical sidewall portion 60 coincides with the second dielectric layer 54.

A metal, which is selective to SiO$_2$, such as W or Mo, is then deposited within the contact 56 to form plug 62 as shown in FIG. 3c. Since the metal of plug 62 is selective to SiO$_2$, it is not deposited on the sidewalls 60 while it is deposited on the sidewalls 58 and the bottom surface 63 of the contact 56. The nonselectivity of the first dielectric layer 52 allows the metal of plug 62 to be deposited in cup-shaped layers 64. The cup-shaped layers 64 are deposited in less time than per the prior art methods in the same manner as described above. The metal of plug 62 is deposited without encroaching upon the substrate material 50 or forming bumps on the top surface 66 of dielectric layer 54.

Although the present invention has been described with respect to specific preferred embodiments thereof, various changes and modifications may be suggested to one skilled in the art, and it is intended that the present invention encompass such changes and modifications as fall within the scope of the appended claims.

What is claimed is:

1. A method for forming a contact plug on a surface of a semiconductor body, comprising the steps of:
   forming a dielectric layer over the surface of the semiconductor body, said dielectric layer having an aperture therethrough with sidewalls comprising silicon nitride;
   depositing a metal into said aperture in such a manner that said metal deposits upon the silicon nitride of the sidewalls of said aperture at a substantially greater rate than upon the surface of said dielectric layer.

2. The method of claim 1, wherein the step of forming a dielectric layer comprises depositing a layer of phosphorus doped silicon dioxide.

3. The method of claim 2, wherein the step of depositing comprises chemical vapor deposition.

4. The method of claim 2, wherein the step of depositing comprises plasma enhanced chemical vapor deposition.

5. The method of claim 2, wherein the step of forming said dielectric layer comprises:
   depositing a layer of silicon dioxide;
   etching through said layer of silicon dioxide to form said aperture;
   depositing a layer of silicon nitride over said silicon dioxide layer and into said aperture;
   etching said layer of silicon nitride to remove said layer of silicon nitride from the surface of said layer of silicon dioxide, and so that silicon nitride remains on said sidewalls.

6. The method of claim 5, wherein the step of etching said layer of silicon nitride comprises anisotropic etching.

7. The method of claim 1, wherein the step of depositing a metal comprises chemical vapor depositing tungsten.

8. The method of claim 1, wherein the step of depositing a metal comprises chemical vapor depositing molybdenum.

9. The method of claim 1, wherein the step of forming a dielectric layer comprises:
   depositing a first layer of silicon nitride; and
   depositing a second layer of phosphorus doped silicon dioxide over said first layer.

10. The method of claim 9, wherein the step of forming a hole comprises etching through said second layer and said first layer.

11. The method of claim 9, wherein the steps of depositing comprise chemical vapor deposition.

12. The method of claim 9, wherein the step of depositing comprises plasma enhanced chemical vapor deposition.

* * * * *